United States Patent

Ishikawa et al.

[15] 3,658,489

[45] Apr. 25, 1972

[54] LAMINATED ELECTRODE FOR A SEMICONDUCTOR DEVICE

[72] Inventors: Masaoki Ishikawa; Daizaburo Shinoda, both of Tokyo, Japan

[73] Assignee: Nippon Electric Company, Limited, Tokyo, Japan

[22] Filed: July 30, 1969

[21] Appl. No.: 846,139

[30] Foreign Application Priority Data

Aug. 9, 1968 Japan....................................43/56990

[52] U.S. Cl...............................29/195, 29/590, 317/234 L, 317/234 M

[51] Int. Cl........................................B32b 15/04, H01l 1/14

[58] Field of Search.................29/195, 589, 590; 317/234 L, 317/234 M

[56] References Cited

UNITED STATES PATENTS

| | | | |
|---|---|---|---|
| 3,274,670 | 9/1966 | Lepselter | 317/234 L |
| 3,287,612 | 11/1966 | Lepselter | 317/234 M |
| 3,335,338 | 8/1967 | Lepselter | 317/234 M |
| 3,388,048 | 6/1968 | Szabo | 204/15 |
| 3,421,206 | 1/1969 | Baker et al | 29/589 |
| 3,421,985 | 1/1969 | Baker et al | 204/15 |
| 3,442,701 | 5/1969 | Lepselter | 117/212 |
| 3,461,524 | 8/1969 | Lepselter | 29/25.42 |
| 3,507,756 | 4/1970 | Wenger | 204/15 |
| 3,560,358 | 2/1971 | Black | 204/143 |

*Primary Examiner*—L. Dewayne Rutledge
*Assistant Examiner*—E. L. Weise
*Attorney*—Sandoe, Hopgood and Calimafde

[57] ABSTRACT

In the process of forming electrodes for semiconductor devices wherein a platinum layer is to be photo mask etched, the process is improved by replacing the platinum layer with a layer of platinum-nickel alloy containing 1 to 20 atomic percent nickel.

1 Claim, 2 Drawing Figures

Figure 1:
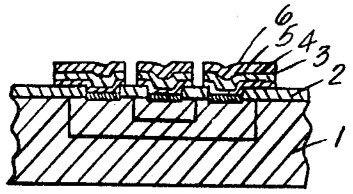

INVENTORS
MASAOKI ISHIKAWA
DAIZABURO SHINODA
BY Sandoe, Hopgood and Calimafde
ATTORNEYS

LAMINATED ELECTRODE FOR A SEMICONDUCTOR DEVICE

This invention relates to a semiconductor device, and more specifically to the structure of planar type semiconductor device and integrated circuit. It provides an electrode structure which forms highly heat-resistant and reliable ohmic contacts and protects them against deterioration of electrical characteristics.

BACKGROUND OF THE INVENTION

Recent trends for smaller semiconductor devices with higher degrees of circuit integration have made high reliability of these devices imperative. In general, the reliability of a semiconductor device depends upon a number of factors. One of the most important is the quality and stability of the ohmic contacts. Heretofore, aluminum has been used as an electrode material for ordinary planar type semiconductor devices and integrated circuits. The use of aluminum for this purpose has several drawbacks, however, in that (1) it reacts with gold employed as lead wires and forms a highly resistant alloy with less mechanical strength, and (2) it is susceptible to corrosive attacks from the outside because of the insufficient chemical stability inherent in aluminum. Recently a process for obtaining very stable and reliable ohmic contacts has been developed (see for example M.P. Lepselter, "Bell System Technical Journal," "vol. 45," (1966), p. 233), which consists of depositing platinum by sputtering or vacuum evaporation on a silicon surface where the electrodes are to be formed, subjecting the coated surface to a heat treatment thereby forming a platinum silicide along the interface, removing the unreacted platinum by a chemical treatment, again depositing thin films of titanium and platinum over the entire surface of the semiconductor device, processing the thin films by photo mask etching to a desired configuration, and then coating the surface with a gold film formed by electroplating. The process ensures good reliability as compared with the process using aluminum, but is complex and involves considerable difficulties in practice. One such difficulty lies in the processing of the electrodes by photo mask etching of the platinum film. The mixed solution of nitric and hydrochloric acid, particularly aqua regia which is the most popular etchant for platinum, attacks the photo resist film so easily that electrodes of a delicate structure cannot be obtained. In an effort to overcome this difficulty, it is often the practice to deposit a film of a metal such as titanium over the platinum surface and utilize it subsequently as a mask for the etching of platinum. This requires an additional step of depositing the metallic film mask and, where titanium is employed as the metallic mask, the etching of the titanium tends to cause simultaneous etching of the titanium underlying the platinum film.

OBJECTS OF THE INVENTION

It is therefore an object of the present invention to provide a semiconductor device having highly heat-resistant and reliable ohmic contacts.

Another object of the invention is to obviate the difficulties conventionally found in the photo mask etching of the platinum film in the manufacture of a semiconductor device having such high-reliability ohmic electrodes.

The above-mentioned and other features and objects of the invention and the manner of attaining them will become more apparent and the invention itself will best be understood by reference to the following description of an embodiment of the invention taken in conjunction with the accompanying drawings, the description of which follows.

Figure 2:
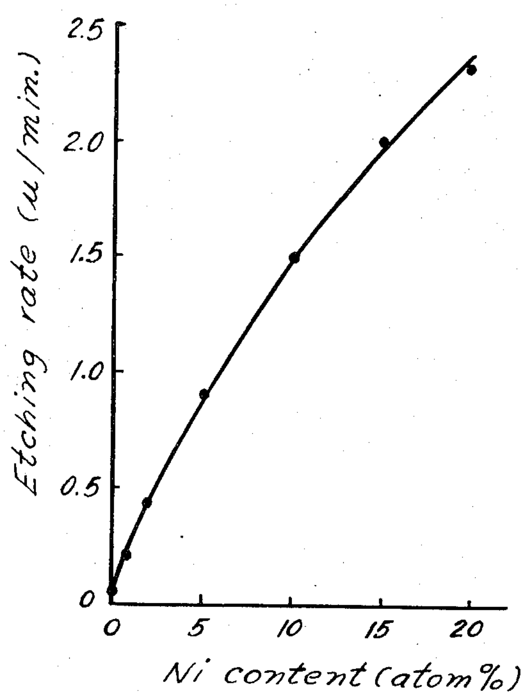

FIG. 1 schematically illustrates the structure of a semiconductor device according to an embodiment of this invention; and FIG. 2 is a graph showing variation of the etching rate of a platinum-nickel alloy by an etching solution consisting of one part each of aqua regia and water.

A transistor and diode are formed in the usual manner on a silicon substrate 1, and the silicon oxide film 2 is formed with holes at predetermined points where ohmic contacts are to be provided. Platinum or a platinum-nickel alloy containing from 1 to 20 atomic percent of nickel is then deposited by sputtering or vacuum evaporation and heat treated to form a silicide 3. Unreacted platinum or platinum-nickel alloy is removed by a chemical treatment. Next, a titanium film 4 and a platinum-nickel alloy film 5 are formed thereover, again by sputtering or vacuum evaporation. The coated layers are processed to a desired configuration by photo mask etching, and finally gold 6 is deposited by electroplating over the platinum-nickel alloy film. The semiconductor device fabricated in this way is extremely stable and reliable like the aforementioned semiconductor device which has ohmic electrodes of platinum silicide-titanium-platinum-gold. The device according to the present invention has the additional advantage of improved yield in the fabrication process because the photo mask etching of the electrodes is facilitated by the use of the platinum-nickel alloy.

FIG. 2 is a graph showing changes of the etching rate of platinum-nickel alloy by a mixed solution of one part aqua regia and one part water with different nickel contents of the alloy. The etching rate is plotted on the axis of ordinate against the nickel content on the axis of abscissa. At an etchant temperature of 70°C. the etching rate of pure platinum is about 400 A/min. Therefore, if the platinum film is 2000 A in thickness, it takes about 5 minutes to be etched away. The etching time is long enough for etchants to corrode ordinary photo resist films and make the finishing to delicate configurations totally impossible. On the other hand, as can be seen from FIG. 2, the etching rate of a platinum-nickel alloy having a nickel content of about one atomic percent is approximately four times as fast as the rate of pure platinum. Although the etching rate of such alloy rises with an increase in the nickel content, a semiconductor device using a platinum-nickel alloy containing more than 20 atomic percent nickel exhibits decreased thermal resistance.

While the principles of the invention have been described in connection with specific apparatus, it is to be clearly understood that this description is made only by way of example and not as a limitation to the scope of the invention.

What is claimed is:

1. A laminated electrode for use in a semiconductor device, comprising a layer of a platinum-nickel alloy containing from 1 to 20 atomic percent nickel, sandwiched between layers of titanium and gold.

* * * * *